United States Patent
Li et al.

(10) Patent No.: US 8,378,761 B2
(45) Date of Patent: Feb. 19, 2013

(54) RADIO FREQUENCY FILTER AND FILTERING UNIT THEREOF

(75) Inventors: Shen-Chun Li, Taipei Hsien (TW);
Shou-Kuo Hsu, Taipei Hsien (TW);
Yung-Chieh Chen, Taipei Hsien (TW);
Hsien-Chuan Liang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 621 days.

(21) Appl. No.: 12/646,872

(22) Filed: Dec. 23, 2009

(65) Prior Publication Data
US 2011/0050362 A1   Mar. 3, 2011

(30) Foreign Application Priority Data
Aug. 27, 2009   (CN) .......................... 2009 1 0306220

(51) Int. Cl.
*H03H 7/01*   (2006.01)

(52) U.S. Cl. ....................................... 333/168; 333/185
(58) Field of Classification Search .................. 333/175, 333/176, 168, 185
See application file for complete search history.

(56) References Cited

U.S. PATENT DOCUMENTS
2012/0161901 A1*   6/2012   Stevenson et al. ............ 333/175

* cited by examiner

*Primary Examiner* — Robert Pascal
*Assistant Examiner* — Gerald Stevens
(74) *Attorney, Agent, or Firm* — Altis Law Group, Inc.

(57) ABSTRACT

Parameters of a radio frequency filter can be changed by changing structure of each component of the filter. Material of each component, diameters of each of magnetic cylinders, density of each of conductive coils, thickness of a dielectric layer, and thickness of an insulation tube can be changed. When any component needs to be replaced, each cover is rotated, with connection partitions move to two slots of an insulation portion, to detach the filter.

12 Claims, 5 Drawing Sheets

RADIO FREQUENCY FILTER AND FILTERING UNIT THEREOF

CROSS-REFERENCE TO RELATED APPLICATIONS

A relevant subject matter is disclosed in a U.S. patent application Ser. No. 12/629,888 filed on Dec. 3, 2009 and entitled "RADIO FREQUENCY FILTER", a U.S. patent application Ser. No. 12/638,992 filed on Dec. 16, 2009 and entitled "RADIO FREQUENCY FILTER", and a U.S. patent application Ser. No. 12/646,867, filed on the same date and having the same title as the one for this patent application, which are assigned to the same assignee as this patent application.

BACKGROUND

1. Technical Field

The present disclosure relates to radio frequency (RF) filters, and particularly to an adjustable RF filter.

2. Description of Related Art

In response to the use of various frequency bands in electronic devices, filters have also been demanded to remove noise from the frequency bands. Filters are generally designed to remove noise from specific frequency bands, therefore different filters are designed for different applications. Filters designed in this way are not easily adjustable for use in applications other than what they were specifically designed for.

DETAILED DESCRIPTION

Figure 1:
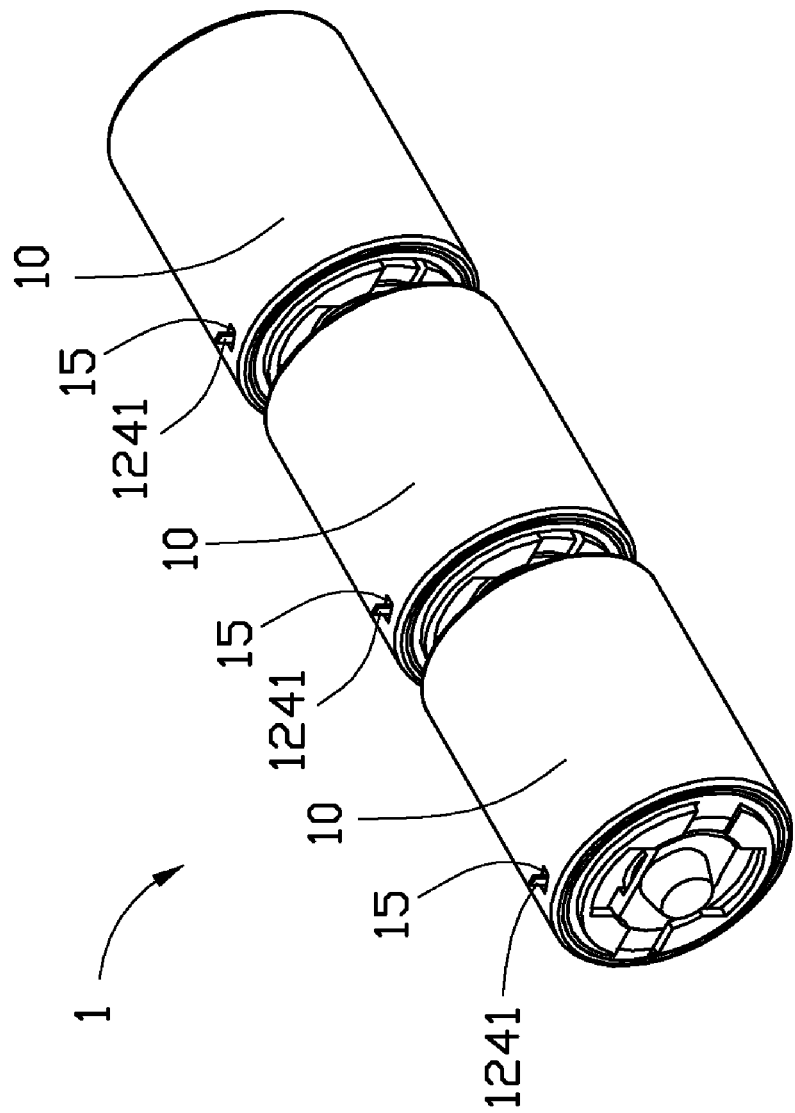
FIG. 1 is an isometric view of an embodiment of a radio frequency (RF) filter, the RF filter includes three filtering units.

Referring to FIG. 1, an embodiment of a radio frequency (RF) filter 1 includes at least one filtering units 10. In the illustrated embodiment, the at least one filtering units 10 includes three filtering units 10. The three filtering units 10 are placed in series.

Figure 2:
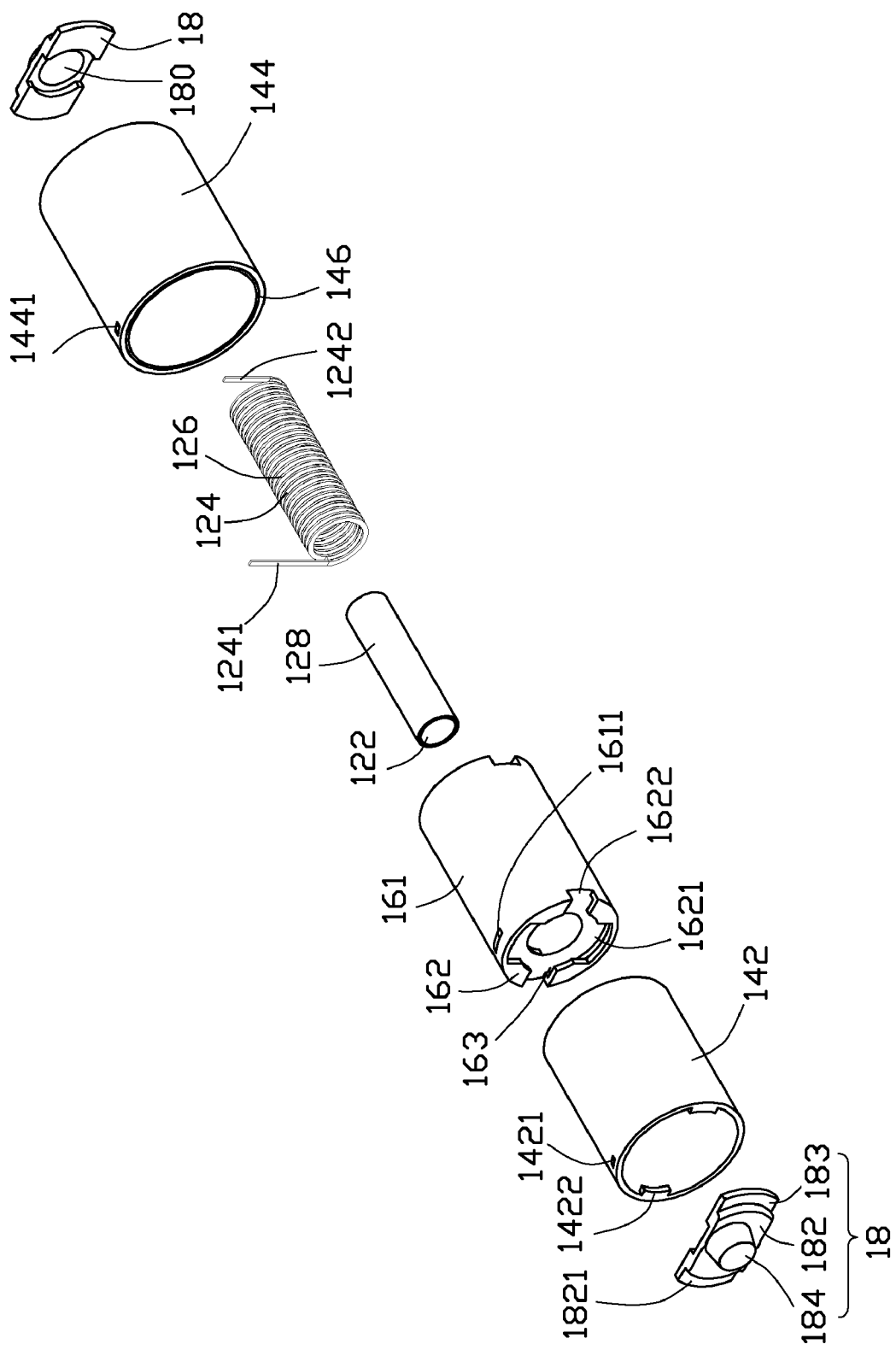
FIGS. 2 and 3 are exploded, isometric views of one of the filtering units of FIG. 1, viewed from different perspectives, the filtering unit includes an insulation tube.
Figure 3:
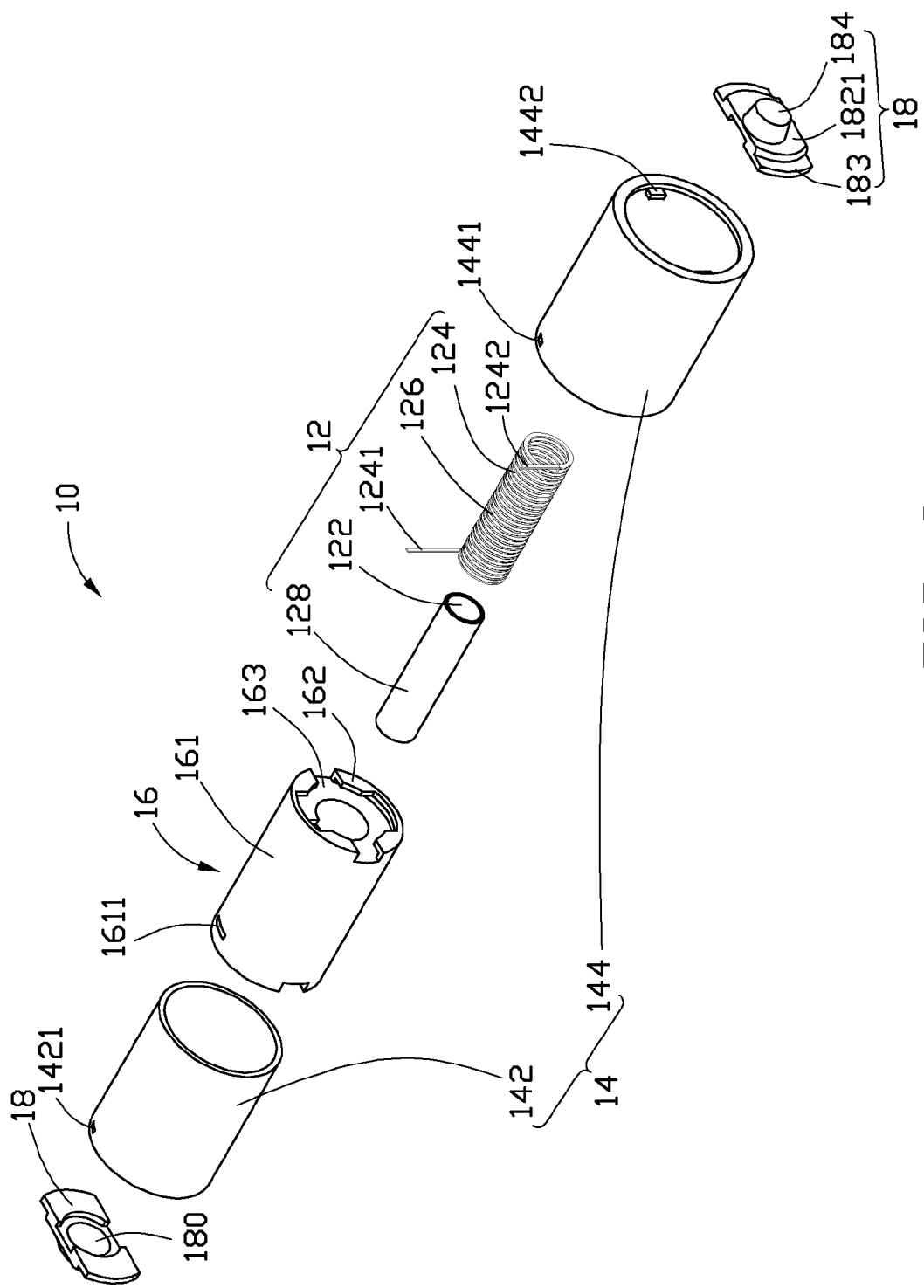
Figure 4:
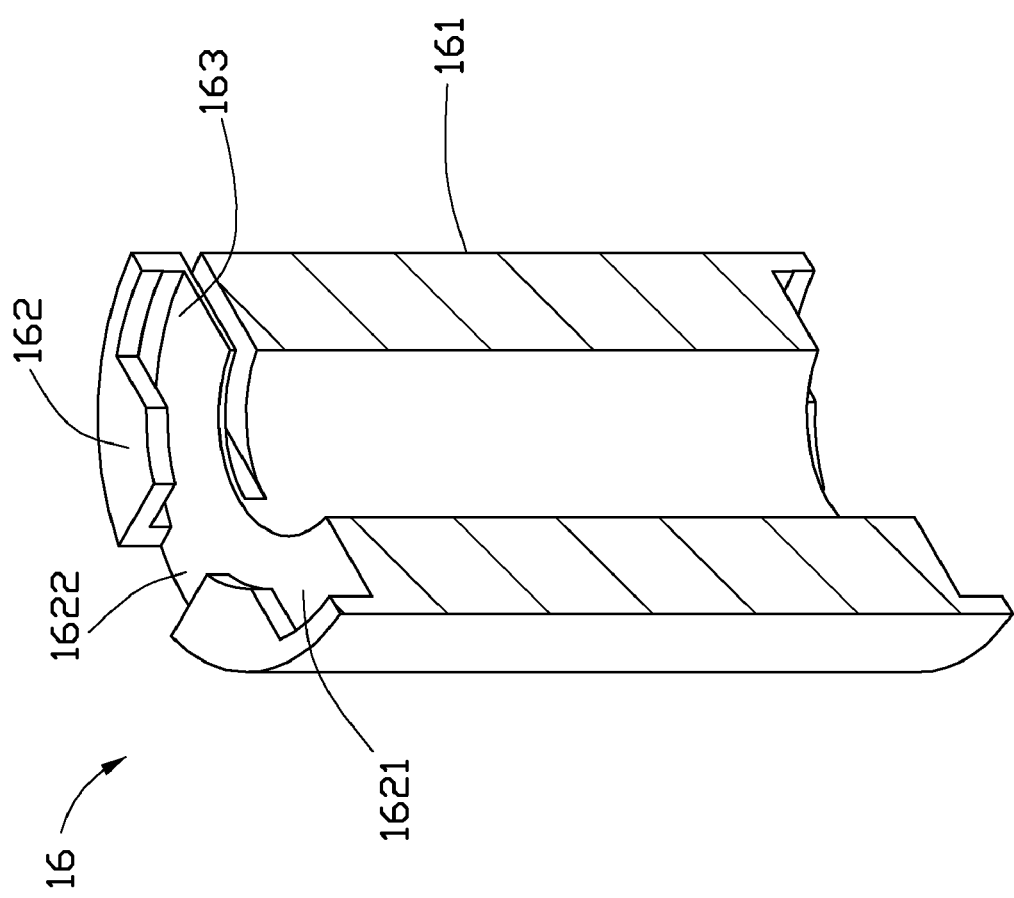
FIG. 4 is a sectional view of the insulation tube of FIGS. 2 and 3.

Referring to FIGS. 2 to 4, each filtering unit 10 includes an inductive component 12, a capacitive component 14, an insulation tube 16, and two covers 18. The inductive component 12 includes a magnetic cylinder 122 and an elastic coil. A dielectric layer 128 covers a circumference of the magnetic cylinder 122. The elastic coil fits around the magnetic cylinder 122. The elastic coil includes a conductive coil 124, and an insulated coil 126. The coil 126 is interleaved with the coil 124 to prevent contact between adjacent rings of the coil 124. The coil 124 includes a first end 1241 and a second end 1242. The magnetic cylinder 122 can be made of a magnetizable material, such as iron, cobalt, nickel, etc. The dielectric layer 128 can be made of glass fiber oxide resin. The inductive component 12 has inductor characteristics.

The capacitive component 14 includes a metal inner tube 142 and a metal outer tube 144. A dielectric layer 146 covers an inner wall of the metal outer tube 144. The metal outer tube 144 fits about the metal inner tube 142. The metal outer tube 144 is insulated from the metal inner tube 142 by the dielectric layer 146. A first through hole 1421 is defined in the metal inner tube 142. A second through hole 1441 is defined in the metal outer tube 144. The first and second through holes 1421 and 1441 are in alignment. Two contacting tabs 1422 radially and symmetrically project from the inner wall of the metal inner tube 142 and adjacent to an end of the metal inner tube 142. Two contacting tabs 1442 radially and symmetrically project from an inner wall of the metal outer tube 144 and adjacent to an end of the metal outer tube 144. In this embodiment, the contacting tabs 1422 and 1442 are formed in opposite ends of the capacitive component 14. The contacting tabs 1422 are arranged adjacent to the first and second through holes 1421 and 1441, and the contacting tabs 1442 are far away from the first and second through holes 1421 and 1441. The capacitive component 14 has capacitor characteristics.

The insulation tube 16 includes a hollow cylindrical-shaped main body 161 and two annular-shaped insulation portions 162 extending from opposite end surfaces of the main body 161. A receiving cavity 163 is defined between the main body 62 and each insulation portion 64. Two grooves 1621 are symmetrically defined in each insulation portion 162. Two slots 1622 are symmetrically defined in each insulation portion 162. The two grooves 1621 and the two slots 1622 are staggeredly arranged and communicate with one another. A third through hole 1611 is defined in the insulation tube 16, adjacent to an end of the insulation tube 16.

The two covers 18 have conductive characteristics. Each of the two covers 18 includes a main body 182 with two opposite arc-shaped edges 1821, and two arc-shaped connection portions 183 extending out from the edges 1821. The connection portions 183 are depressed to a bottom of the main body 182. A circular-shaped opening 180 is defined in a center of the bottom of the main body 182. A protrusion 184 is formed from a side bounding the opening 180 of the cover 18 and covers the opening 180. A width of each connection portion 183 is less than or equal to a width of a corresponding groove 1621 of the insulation portion 162, and is greater than a width of a corresponding slot 1622 of the insulation portion 162.

In assembly, the capacitance component 14 fits about the insulation tube 16. The inductive component 12 is received in the insulation tube 16. The third through hole 1611 aligns with the first and second holes 1421 and 1441, forming a through hole 15. The insulation tube 16 can prevent the inductive component 12 from interfering with the capacitive component 14. The metal outer tube 144 is longer than the metal inner tube 142, preventing the two contacting tabs 1442 from contacting with the metal inner tube 142. The two contacting tabs 1422 of the metal inner tube 142 pass through the two slots 1622 of one insulation portion 162 respectively. The two contacting tabs 1442 of the metal outer tube 142 passes through the two slots 1622 of the other insulation portion 162 respectively.

The two covers 18 are mounted to opposite ends of the insulation tube 16 via the grooves 1621. The connection portions 183 of each cover 18 are received in a corresponding receiving cavity 163 from the corresponding grooves 1622. The two edges 1821 of the main body 182 of each cover 18 resist against a corresponding insulation portion 162. The connection portions 183 of each cover 18 can rotatably slide in the corresponding receiving cavity 163. The connection portions 183 of one of the covers 18 contact with the two contacting tabs 1422 respectively, in response to sliding to the corresponding slots 1621. Similarly, the connection portions 183 of the other one of the covers 18 contact with the two contacting tabs 1442 respectively. Therefore, the one of the covers 18 is electrically connected to the metal inner tube 142. The other one of the covers 18 is electrically connected to the metal outer tube 144. The first end 1241 of the conductive coil 124 passes through the through hole 15 to be grounded, without contacting the covers 18. The second end 1242 of the conductive coil 124 resists against the cover 18 which is connected to the metal outer tube 144. Therefore, the second end 1242 of the conductive coil 124 is electrically connected to the metal outer tube 144.

The cover 18 connected to the metal inner tube 142 is used as an input terminal of each filtering unit 10. The cover 18 connected to the metal outer tube 144 is used as an output terminal of each filtering unit 10. The input terminal of each of the filtering units 10 receives external signals from an electronic device or is connected an output terminal of another filtering unit 10. The output terminal of each of the filtering units 10 outputs filtered signals to another electronic device, or is connected to an input terminal of another filtering unit 10. In this embodiment, the three filtering units 10 are connected in series via the protrusions 184 of the corresponding covers 18.

In this embodiment, the contacting tabs 1422 and 1442 are used to respectively connect the metal inner tube 142 and the metal outer tube 144 to the covers 18. The numbers of the contacting tabs 1422, 1442, and the corresponding slots 1622 can be changed.

Figure 5:
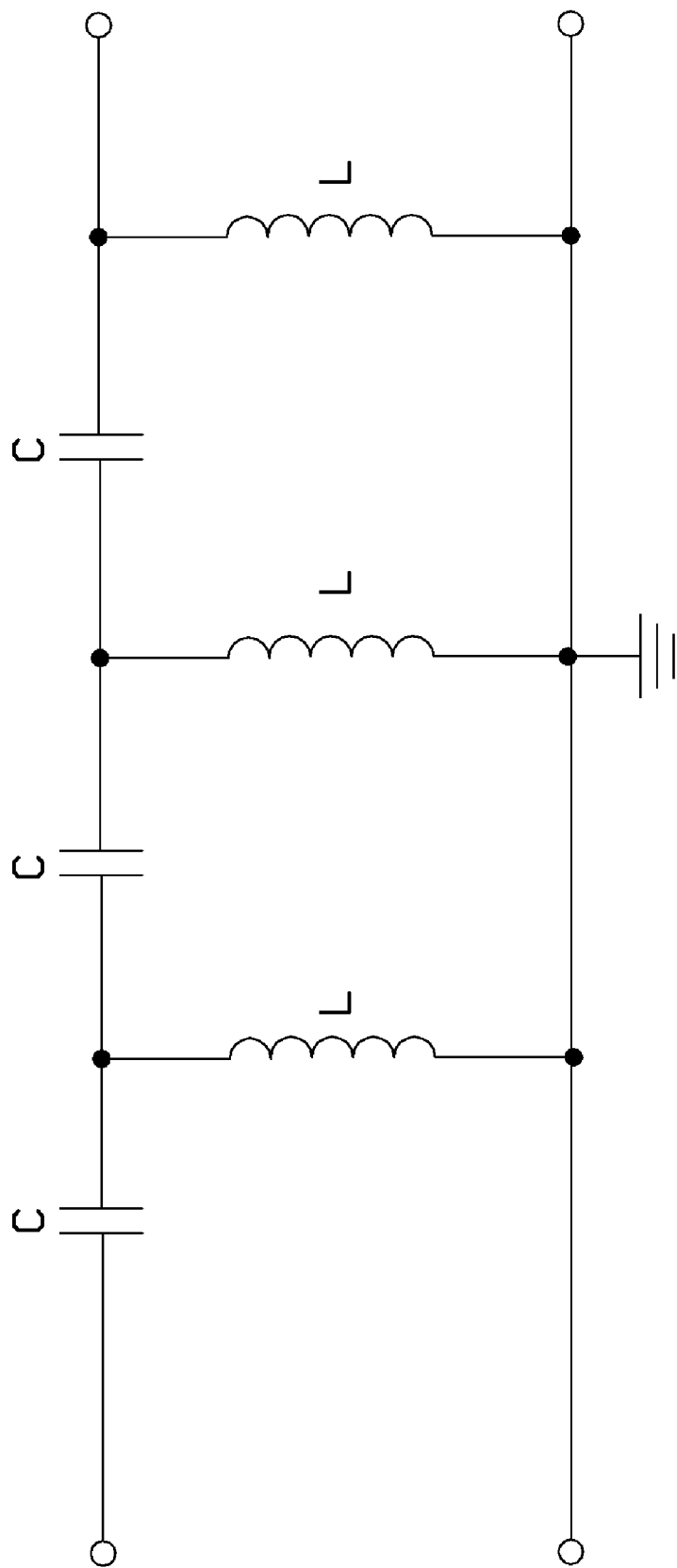
FIG. 5 is an equivalent circuit diagram of the RF filter of FIG. 1.

Referring to FIG. 5, an equivalent circuit of the filter 1 includes three inductors L and three capacitors C. The three capacitors C are connected in series. The three inductors L are connected in parallel. The inductive component 12 and the capacitance 14 of each of the filtering units 10 are equivalent to a capacitor C and a corresponding inductor L, which are connected in series. The metal inner tube 142 and the metal outer tube 144 of each of the capacitive components 14 are equivalent to two terminals of the corresponding capacitor C. The first end 1241 and the second end 1242 are respectively equivalent to two terminals of the corresponding inductor L. The first end 1241 is equivalent to the grounded terminal of the corresponding inductor L. Therefore, the filter 1 functions as a high pass filter.

Parameters of the filter 1 can be changed by changing structure of each component of the filter 1. For example, material of each component, diameters of each of the magnetic cylinders 122, density of each of the conductive coils 124, thickness of the dielectric layers 128, thickness of the insulation tubes 16, and number of the filtering units 10 can be changed. When any component needs to be replaced, a corresponding cover 18 is rotated, with the connection partitions 183 moving to the two grooves 1621 of the insulation portion 162, to detach the filter 1.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A filtering unit comprising:
   an insulation tube;
   an inductance component received in the insulation tube, the inductance component comprising a magnetic cylinder and a conductive coil fitting around and insulated from the magnetic cylinder;
   a first conductive cover detachably mounted to a first end of the insulation tube, and electrically contacting with a first end of the conductive coil;
   a second conductive cover detachably mounted to a second end of the insulation tube; and
   a capacitance component comprising a metal inner tube fitting around the insulation tube, and a metal outer tube insulated from and fitting around the metal inner tube, at least one first contacting end perpendicularly projecting from an inner wall of the metal inner tube and passing through the insulation tube to contact with the first conductive cover; at least one second contacting end perpendicularly projecting from an inner wall of the metal outer tube and passing through the insulation tube to contact with the second conductive cover without contacting with the metal inner tube; wherein
   a second end of the conductive coil passes through the insulation tube and the capacitance component to be grounded, without electrically contacting with the capacitance component; the first and second conductive covers of the filtering unit function as an input terminal and an output terminal, respectively.

2. The filtering unit of claim 1, wherein the insulation tube comprises a hollow main body and two insulation portions extending from opposite end surfaces of the hollow main body, respectively, a receiving cavity is defined between each of the two insulation portions and a corresponding one of the opposite end surfaces, to receive a corresponding one of the first and second conductive covers, two grooves are symmetrically defined in each of the two insulation portions, allowing the first or second conductive cover to enter into the corresponding receiving cavity, at least one slot is defined in each of the two insulation portions, allowing the at least one first or the at least one second contacting end to pass through the insulation tube.

3. The filtering unit of claim 2, wherein each of the first and second conductive covers comprises a main body, the main body comprises two opposite edges and two connection portions extending out from the two opposite edges respectively, the two connection portions are depressed to a bottom of the main body, the two connection portions are received in the corresponding receiving cavity through the two grooves of a corresponding one of the two insulation portions, with the two opposite edges of the main body resisting against the corresponding insulation portion, the two connection portions are operable to rotatably slide in a corresponding one of the receiving cavities, the at least one first contacting end electrically contacts with the at least one connection portion of the first conductive cover, the at least one second contacting end electrically contacts with the at least one connection portion of the second conductive cover.

4. The filtering unit of claim 1, wherein the inductive component further comprises an insulated coil interleaved with the conductive coil to prevent contact between adjacent rings of the conductive coil.

5. The filtering unit of claim 1, wherein a dielectric layer covers a circumference of the magnetic cylinder.

6. The filtering unit of claim 5, the dielectric layer is made of glass fiber oxide resin.

7. The filtering unit of claim 1, wherein the magnetic cylinder is made of a magnetizable material.

8. The filtering unit of claim 1, wherein a through hole is defined through the insulation tube and the capacitance component, the second end of the conductive coil passes through the through hole.

9. The filtering unit of claim 1, wherein the metal outer tube is longer than the metal inner tube, preventing the at least one second contacting end from contacting with the metal inner tube.

10. The filtering unit of claim 1, wherein each of the first and second conductive covers comprises a main body, an opening is defined in a center of the main body, a protrusion is formed from the main body and covers the corresponding opening, the protrusions of the main bodies of the first and second conductive covers function as the input terminal and the output terminal of the filtering unit, respectively.

11. A filter comprising a plurality of filtering units, each one of the plurality of filtering units comprising:
an insulation tube;
an inductance component received in the insulation tube, the inductance component comprising a magnetic cylinder and a conductive coil fitting around and insulated from the magnetic cylinder;
a first conductive cover detachably mounted to a first end of the insulation tube, and electrically contacting with a first end of the conductive coil;
a second conductive cover detachably mounted to a second end of the insulation tube; and
a capacitance component comprising a metal inner tube fitting around the insulation tube, and a metal outer tube insulated from and fitting around the metal inner tube, at least one first contacting end perpendicularly projects from an inner surface of a wall of the metal inner tube and passes through the insulation tube to contact with the first conductive cover; at least one second contacting end perpendicularly projecting from an inner wall of the metal outer tube and passing through the insulation tube to contact with the second conductive cover without contacting with the metal inner tube; wherein
a second end of the conductive coil passes through the insulation tube and the capacitance component to be grounded, without electrically connecting to the capacitance component; the first and second conductive covers of each of the plurality of filtering units function as an input terminal and an output terminal, respectively, the plurality of filtering units are connected in series via corresponding first and second conductive covers.

12. The filter of claim 11, wherein each of the first and second conductive covers comprises a main body, an opening is defined in a center of each main body, a protrusion is formed from the main body of each of the first and second conductive covers and covers the corresponding opening, the protrusion of the first conductive cover of each of the plurality of filtering units contacts with a protrusion of a corresponding second conductive cover, or receives external signals, the protrusion of the second conductive cover of each of the plurality of filtering units contacts with a protrusion of the corresponding first conductive cover, or outputs filtered signals.

* * * * *